United States Patent [19]
Eichman et al.

[11] Patent Number: 5,279,857
[45] Date of Patent: Jan. 18, 1994

[54] PROCESS FOR FORMING LOW RESISTIVITY TITANIUM NITRIDE FILMS

[75] Inventors: Eric C. Eichman; Bruce A. Sommer, both of Phoenix; Michael J. Churley, Tempe, all of Ariz.

[73] Assignee: Materials Research Corporation, Orangeburg, N.Y.

[21] Appl. No.: 746,667

[22] Filed: Aug. 16, 1991

[51] Int. Cl.$^5$ ............... C23C 16/34; C23C 16/46; B05D 3/04
[52] U.S. Cl. .................. 427/255; 427/255.1; 427/337; 427/343
[58] Field of Search ............ 427/255.2, 255.1, 249, 427/337, 343, 248.1, 255

[56] References Cited

U.S. PATENT DOCUMENTS

| | | | |
|---|---|---|---|
| 2,865,791 | 12/1958 | Ruppert et al. | |
| 3,959,557 | 5/1976 | Berry | 428/368 |
| 4,535,000 | 8/1985 | Gordon | 427/160 |
| 4,570,328 | 2/1986 | Price et al. | |
| 4,803,127 | 2/1989 | Hakim | 428/457 |

OTHER PUBLICATIONS

X. Xiang, Plasma Chemical Vapour Deposition of TiC, TiC/TiN and Dispersed T.(CN).
Proceedings of the 1986 China-Japan Symposium on Thin Films, Beijing, China Sep. 22–24, 1986.
F. Pintchovski, et al., "LPCVD Titanium Nitride—Deposition, Properties, and Aplication to ULSI", *Tungsten and Other Refractory Metals for ULSI Applications*, No. IV, 1989, pp. 275–282.
A. Sherman, "Growth and Properties of LPCVD Titanium Nitride as a Diffusion Barrier for Silicon Device Technology", J. Electrochm, Soc., vol. 137, No. 6, Jun. 1990.
S. R. Kurtz et al., "Chemical Vapor Deposition of Titanium Nitride at Low Temperature", *Thin Solid Films*, 140 (1986), pp. 277–290.
Travis et al. "A Scalable Submicron Contact Technology Using Conformal LPCVD TiN", iIDEM Conference Proceedings, Dec. 1990.
Buiting, et al., "Kinetical Aspects of the LPCVD of Titanium Nitride from Titanium Tetrachloride and Ammonia", J. Electrochem. Soc., vol. 138, No. 2, Feb. 1991, pp. 500–505.

*Primary Examiner*—Shrive Beck
*Assistant Examiner*—Bret Chen
*Attorney, Agent, or Firm*—Wood, Herron & Evans

[57] ABSTRACT

A process for forming low resistivity titanium nitride films on a silicon substrate by chemical vapor deposition includes a post-deposition ammonia anneal to provide hydrogen atoms which chemically react with chlorine atoms entrained within the titanium nitride film. The titanium nitride film is deposited by placing the silicon substrate in a reaction chamber, heating the silicon substrate within the reaction chamber, initially passing both TiCl$_4$ gas and NH$_3$ gas into the reaction chamber over the silicon substrate to deposit titanium nitride upon a surface of the silicon substrate, and thereafter discontinuing the flow of TiCl$_4$ gas while continuing to pass NH$_3$ gas into the reaction chamber over the silicon substrate to react with and remove residual chlorine atoms retained by the deposited titanium nitride film.

10 Claims, 1 Drawing Sheet

PROCESS FOR FORMING LOW RESISTIVITY TITANIUM NITRIDE FILMS

BACKGROUND OF THE INVENTION

1. Field of the Invention

The present invention relates generally to semiconductor substrates having thin films of titanium nitride (TiN) deposited thereon by low pressure chemical vapor deposition (LPCVD) methods, and more particularly, to a process for reducing the chlorine content of such TiN films for lessening the resistivity of such films.

2. Description of the Prior Art

It is well known in the semiconductor industry to use thin films of titanium nitride (TiN) as a barrier metal for semiconductor devices. Such thin films of TiN can be deposited using chemical vapor deposition (CVD) techniques. As a barrier metal, such thin films of TiN may be deposited over semiconductor contact areas prior to formation of aluminum contact layers to prevent the aluminum connection layer from directly contacting the underlying semiconductor material, which is most typically silicon. Such TiN films provide good step coverage over the surface of the semiconductor substrate, particularly within submicron contacts. Such TiN films also provide low contact resistance to salicide, low leakage, excellent adhesion to the underlying semiconductor substrate, and high thermal stability. Such TiN films also provide good adhesion for subsequent films of tungsten.

In Sherman, "Growth and Properties of LPCVD Titanium Nitride as a Diffusion Barrier for Silicon Device Technology", J. Electrochem. Soc., Vol. 137, No. 6, June 1990, a process is described for depositing thin films of TiN upon a silicon substrate in a single-wafer cold wall reactor using a low pressure CVD (LPCVD) process.

Accordingly, it is an object of the present invention to provide a process for forming titanium nitride films upon silicon substrates having a decreased sheet resistance.

It is another object of the present invention to provide a process for forming titanium nitride films upon silicon substrates having more uniform sheet resistance.

It is still another object of the present invention to provide a process for forming titanium nitride films upon silicon substrates wherein such titanium nitride films have a decreased chlorine content.

It is yet another object of the present invention to provide such a process which can be performed without substantially altering the flow gases or apparatus commonly used to deposit such titanium nitride films.

These and other objects of the present invention will become more apparent to those skilled in the art as the description thereof proceeds.

SUMMARY OF INVENTION

Briefly described, and in accordance with the preferred embodiments thereof, the present invention relates to a process for forming low resistivity titanium nitride films on a silicon substrate by chemical vapor deposition, wherein the process includes the steps of placing the silicon substrate in a reaction chamber, heating the silicon substrate within the reaction chamber, initially passing both $TiCl_4$ gas and $NH_3$ gas into the reaction chamber over the silicon substrate to deposit titanium nitride upon a surface of the silicon substrate, and thereafter discontinuing the flow of $TiCl_4$ gas while passing a hydrogen-bearing gas that is reactive with chlorine into the reaction chamber over the silicon substrate to react with and remove residual chlorine atoms retained by the deposited titanium nitride film.

The aforementioned hydrogen-bearing gas is preferably $NH_3$ gas. In the preferred embodiment of the present invention, the initial flow of $NH_3$ gas into the reaction chamber is continued over the silicon substrate after the flow of $TiCl_4$ gas is discontinued, allowing hydrogen atoms to react with residual chlorine retained by the deposited titanium nitride film at the end of the titanium nitride growth cycle as a post deposition process. The hydrogen atoms react with the chlorine atoms to form gaseous components that leave the titanium nitride film surface.

DETAILED DESCRIPTION OF THE PREFERRED EMBODIMENT

Figure 1:
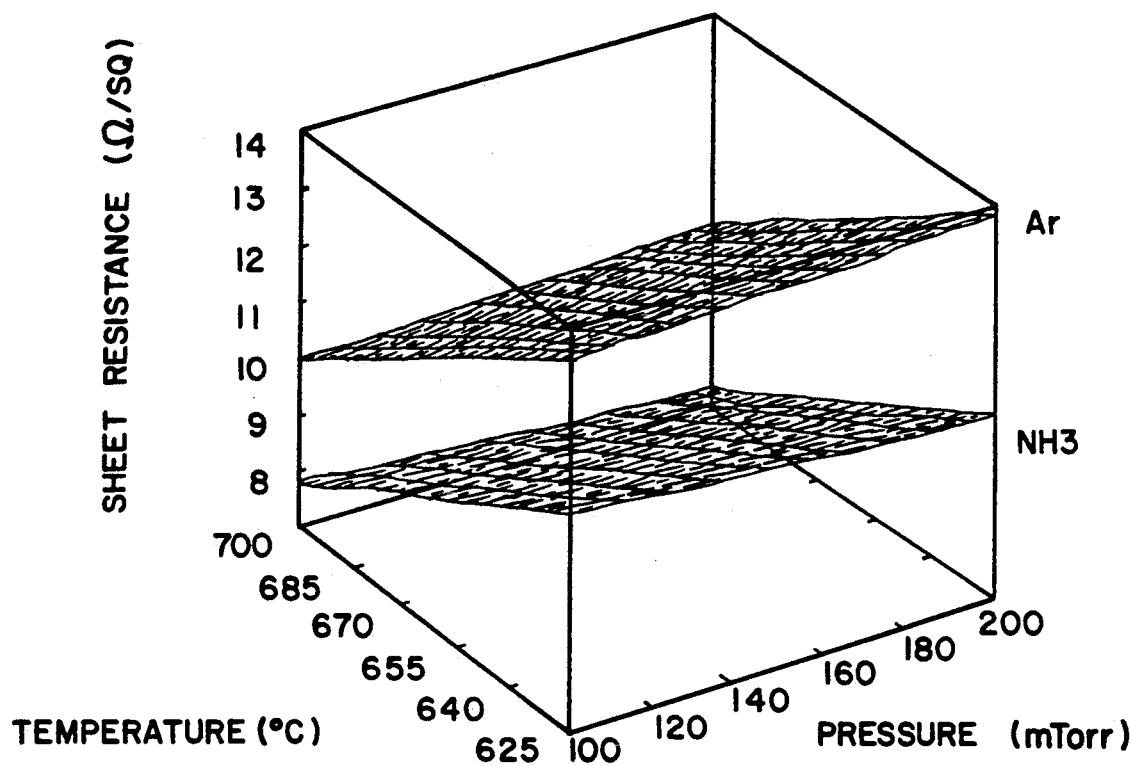
FIG. 1 is a three-dimensional plot showing sheet resistance of a deposited titanium nitride layer over a range of temperatures and pressures for both a post-deposition argon inert gas anneal and a post-deposition ammonia ($NH_3$ gas) anneal step.

In the preferred embodiment of the present invention, titanium nitride films are deposited upon silicon substrates using low pressure chemical vapor deposition (LPCVD) techniques. A silicon wafer is loaded into a reaction chamber, and $TiCl_4$ gas and $NH_3$ gas are caused to pass over the silicon wafer. The $TiCl_4$ gas and $NH_3$ gas react to deposit a titanium nitride (TiN) film upon the exposed surface of the silicon wafer.

However, LPCVD TiN films deposited from $TiCl_4$ gas and $NH_3$ gas incorporate a large amount of chlorine in the film. This chlorine has been found to be concentrated at the grain boundaries and film interfaces. The use of $NH_3$ gas to react and strip off the remaining unbound chlorine has been found by Applicants to be effective in lowering the chlorine film content. Applicants believe that the hydrogen gas reacts with the chlorine atoms to form HCl gas that is carried off away from the titanium nitride film.

The present process of using $NH_3$ gas to react and strip off the remaining unbound chlorine is preferably performed insitu at the end of the TiN growth cycle as a post deposition process. The use of $NH_3$ gas differs from simple diffusion mechanisms, such as the use of inert gases like argon or nitrogen, which fail to strip off all the available chlorine. For example, in FIG. 1, a plot is shown indicating sheet resistance of the deposited titanium nitride layer over a range of temperatures and pressures for both a post-deposition argon anneal and a post-deposition ammonia ($NH_3$ gas) anneal step. As shown by FIG. 1, the sheet resistance is continuously lower when the ammonia anneal step is performed as compared with the argon anneal step. Applicants believe that standard post deposition annealing treatments in inert environments merely activate chlorine diffusion through the film; however, this diffusion mechanism does not reactively separate the bound chlorine from the grain boundaries.

The use of an insitu ammonia anneal step accomplishes two objectives. First, the chloride content of the titanium nitride film can be reduced from approximately 2% to 0.7%, which allows the film resistivity to be reduced. Secondly, the sheet resistance uniformity is improved from approximately 8% to 4%.

In practicing the present invention, a single-wafer LPCVD TiN reactor is preferably used. The temperature range within the reactor during the anneal step may be from 600 degrees Centigrade to 700 degrees Centigrade, with the temperature range of 650–680 degrees Centigrade being preferred. The preferred pressure range within the reactor was 115 mTorr to 300 mTorr. Preferred gas flow ranges are 10 sccm for TiCl$_4$ gas and 100 sccm for the NH$_3$ gas, wherein the term "sccm" designates standard cubic centimeters per minute. An Argon gas carrier having a flow rate of 30 sccm is added to the TiCl$_4$ gas flow path prior to injection into the reactor to balance the flow through the gas injector manifold of the reaction chamber. The TiCl$_4$ gas and the NH$_3$ gas are injected through two different sets of injector ports to avoid mixing of such gases within the gas manifold prior to injection into the reaction chamber.

In the preferred embodiment, the deposition of the TiN film was conducted for 60 seconds, followed by an ammonia anneal for 60 seconds. The longer the anneal period, the better the resistivity enhancement. Of course, the period for the ammonia anneal is partly dependent upon the temperature. For anneal temperatures within the range of 650–680 degrees Centigrade, the anneal time period varies between 30–90 seconds. At lower temperatures, a longer anneal period is needed to yield the same resisisivity. Most often, the deposition step and anneal step are performed at the same temperature, though the reaction chamber temperature can be quickly raised after the deposition step to lower the anneal time to 30–45 seconds.

It had been theorized by the applicants that merely increasing the percentage of NH$_3$ gas relative to TiCl$_4$ gas during the deposition phase might reduce the tendency for chlorine atoms to be retained within the titanium nitride film. However, experiments conducted by the Applicants failed to show this to be true.

By reducing the titanium nitride film resistivity, one decreases series resistance between the underlying silicon and the overlying metal connection network. Also, by making the sheet resistance of the titanium nitride film more uniform, one increases the yield of working circuits on a semiconductor wafer, thereby lowering the production cost for such circuits.

We claim:

1. A process for forming a low resistivity titanium nitride film on a silicon substrate by chemical vapor deposition, said process comprising in combination the steps of:
   a. placing the silicon substrate in a reaction chamber;
   b. heating the silicon substrate within the reaction chamber;
   c. passing both TiCl$_4$ gas and NH$_3$ gas into the reaction chamber over the heated silicon substrate to deposit titanium nitride upon a surface of the silicon substrate, said deposited film containing chlorine and having a sheet resistivity;
   d. following step c., discontinuing the flow of TiCl$_4$ gas while continuing the flow of NH$_3$ gas into the reaction chamber over the heated silicon substrate to react with residual chlorine retained by the deposited titanium nitride film, thereby lowering the chlorine content of the film and reducing the film sheet resistivity.

2. The process recited by claim 1 wherein the temperature within said reaction chamber during step d. lies within the range of 650–680 degrees Centigrade.

3. The process recited by claim 1 wherein the pressure within said reaction chamber lies within the range of 115 mTorr to 300 mTorr.

4. The process recited by claim 1 wherein the flow of NH$_3$ gas into the reaction chamber over the silicon substrate is continued for approximately 30 seconds to 90 seconds after the flow of TiCl$_4$ gas is discontinued.

5. A process for forming a low resistivity titanium nitride film on a silicon substrate by chemical vapor deposition, said process comprising in combination the steps of:
   a. placing the silicon substrate in a reaction chamber;
   b. heating the silicon substrate within the reaction chamber;
   c. passing both TiCl$_4$ gas and NH$_3$ gas into the reaction chamber over the heated silicon substrate to deposit titanium nitride upon a surface of the silicon substrate, said deposited film containing chlorine and having a sheet resistivity;
   d. following step c., discontinuing the flow of TiCl$_4$ gas while passing a hydrogen-bearing gas that is reactive with chlorine into the reaction chamber over the heated silicon substrate to react with residual chlorine retained by the deposited titanium nitride film, thereby lowering the chlorine content of the film and reducing the film sheet resistivity.

6. The process recited by claim 5 wherein said hydrogen-bearing gas is NH$_3$ gas.

7. A process for forming a low resistivity titanium nitride film on a silicon substrate by chemical vapor deposition, said process comprising in combination the steps of:
   a. placing the silicon substrate in a reaction chamber;
   b. heating the silicon substrate within the reaction chamber;
   c. depositing a titanium nitride film upon the heated silicon substrate by passing thereover TiCl$_4$ gas and at lest one other gas reactive therewith, said deposited film containing chlorine and having a sheet resistivity;
   d. discontinuing the flow of TiCl$_4$ gas; and
   e. passing NH$_3$ gas into the reaction chamber over the heated silicon substrate to react with residual chlorine retained by the deposited titanium nitride film, thereby lowering the chlorine content of the film and reducing the film sheet resistivity.

8. The process recited by claim 7 wherein the temperature within said reaction chamber during step e. lies within the range of 650–680 degrees Centigrade.

9. The process recited by claim 7 wherein the pressure within said reaction chamber lies within the range of 115 mTorr to 300 mTorr.

10. The process recited by claim 7 wherein NH$_3$ gas is passed into the reaction chamber over the silicon substrate in step e. for approximately 30 seconds to 90 seconds after the flow of TiCl$_4$gas is discontinued.

* * * * *